(12) United States Patent
Wu (10) Patent No.: US 12,009,324 B2
(45) Date of Patent: Jun. 11, 2024

(54) SEMICONDUCTOR STRUCTURE AND METHOD FOR FORMING SEMICONDUCTOR STRUCTURE

(71) Applicant: CHANGXIN MEMORY TECHNOLOGIES, INC., Anhui (CN)

(72) Inventor: Ping-Heng Wu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 415 days.

(21) Appl. No.: 17/398,127

(22) Filed: Aug. 10, 2021

(65) Prior Publication Data

US 2022/0028810 A1 Jan. 27, 2022

Related U.S. Application Data

(63) Continuation of application No. PCT/CN2021/100217, filed on Jun. 15, 2021.

(30) Foreign Application Priority Data

Jul. 21, 2020 (CN) .......................... 202010707452.9

(51) Int. Cl.
 *H01L 23/00* (2006.01)
(52) U.S. Cl.
 CPC .............. *H01L 24/05* (2013.01); *H01L 24/03* (2013.01); *H01L 2224/05026* (2013.01); *H01L 2224/05082* (2013.01); *H01L 2924/351* (2013.01)

(58) Field of Classification Search
 CPC ..................... H01L 24/05; H01L 24/03; H01L 2224/05026; H01L 2224/05082; H01L 2924/351
 See application file for complete search history.

(56) References Cited

U.S. PATENT DOCUMENTS

| 8,237,187 B2 | 8/2012 | Huang |
| 10,784,228 B2 | 9/2020 | Kim et al. |
| 2003/0168744 A1* | 9/2003 | Sawada .............. H01L 25/0657 257/E21.597 |
| 2006/0043437 A1* | 3/2006 | Mouli ................. H01L 27/1463 257/292 |
| 2010/0148210 A1 | 6/2010 | Huang |
| 2010/0181589 A1 | 7/2010 | Huang |
| 2015/0076625 A1* | 3/2015 | Noguchi ............. H01L 29/4941 257/412 |

(Continued)

FOREIGN PATENT DOCUMENTS

| CN | 101330067 A | 12/2008 |
| CN | 101488538 A | 7/2009 |
| CN | 101794853 A | 8/2010 |

(Continued)

*Primary Examiner* — Monica D Harrison
*Assistant Examiner* — Andre C Stevenson
(74) *Attorney, Agent, or Firm* — Cooper Legal Group, LLC (57) ABSTRACT

A semiconductor structure and a forming method thereof are provided. The method of forming the semiconductor structure includes: providing a wafer having a front surface and a back surface opposite to the front surface; patterning the back surface of the wafer to form a groove extending from the back surface towards the front surface; forming a dielectric layer at a bottom and a side wall of the groove; and forming, on the dielectric layer, a conductive layer filling the groove.

16 Claims, 11 Drawing Sheets

(56) References Cited

U.S. PATENT DOCUMENTS

2019/0172814 A1    6/2019  Kim et al.
2021/0082803 A1*   3/2021  Wang .................. H01L 21/7685

FOREIGN PATENT DOCUMENTS

| CN | 103367240 A | 10/2013 |
| CN | 102655136 B | 6/2016 |
| CN | 109671692 A | 4/2019 |
| CN | 209029370 U | 6/2019 |

* cited by examiner

SEMICONDUCTOR STRUCTURE AND METHOD FOR FORMING SEMICONDUCTOR STRUCTURE

CROSS-REFERENCE TO RELATED APPLICATIONS

This is a continuation application of International Patent Application No. PCT/CN2021/100217, filed on Jun. 15, 2021, which claims priority to Chinese patent application No. 202010707452.9, filed on Jul. 21, 2020, entitled "Semiconductor Structure and Method For Forming Semiconductor Structure". The disclosures of International Patent Application No. PCT/CN2021/100217 and Chinese patent application No. 202010707452.9 are incorporated by reference herein in their entireties.

TECHNICAL FIELD

Embodiments of the present application relate to the technical field of semiconductors, and in particular to a semiconductor structure and a method for forming the semiconductor structure.

BACKGROUND

In a 3D package of a chip structure, a wafer back region of a wafer is often used to a lay a conductive layer at present. In order to reduce the influence of negative conditions, such as electric leakage of the conductive layer and metal ion migration in the conductive layer, on the wafer back region, a film layer such as a dielectric layer is additionally formed on a wafer back surface in a current process. Then the conductive layer is made in the additionally formed film layer or on a side of the film layer away from a wafer back, so that the isolation of the conductive layer from the wafer is realized.

SUMMARY

According to a first aspect of the present application, the present application provides a method of forming a semiconductor structure. The method may include: providing a wafer having a front surface and a back surface opposite to the front surface; patterning the back surface of the wafer to form a groove extending from the back surface towards the front surface; forming a dielectric layer at a bottom and a side wall of the groove; and forming, on the dielectric layer, a conductive layer filling the groove.

According to a first aspect of the present application, the present application also provides a semiconductor structure. The semiconductor structure may include: a wafer having a front surface and a back surface opposite to the front surface; a groove located in the wafer and extending from the back surface towards the front surface; a dielectric layer covering a bottom and a side wall of the groove; and a conductive layer located on a side of the dielectric layer away from the wafer, and filling the groove.

BRIEF DESCRIPTION OF THE DRAWINGS

One or more embodiments are illustrated by way of example in the figures of the accompanying drawings, which are not to be construed as limiting the embodiments, and in which elements having the same reference numerals represent similar elements and in which the figures are not to scale unless otherwise indicated.

DETAILED DESCRIPTION

Figure 1:
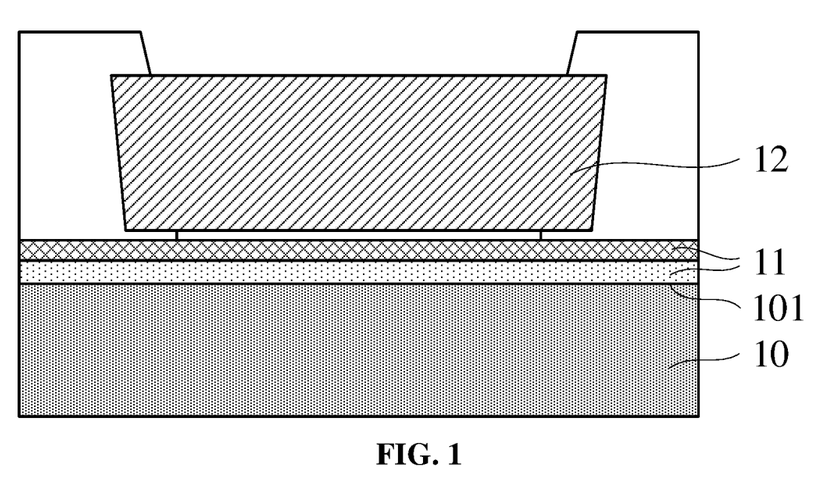
FIGS. 1-3 are schematic diagrams of a semiconductor structure.
Figure 2:
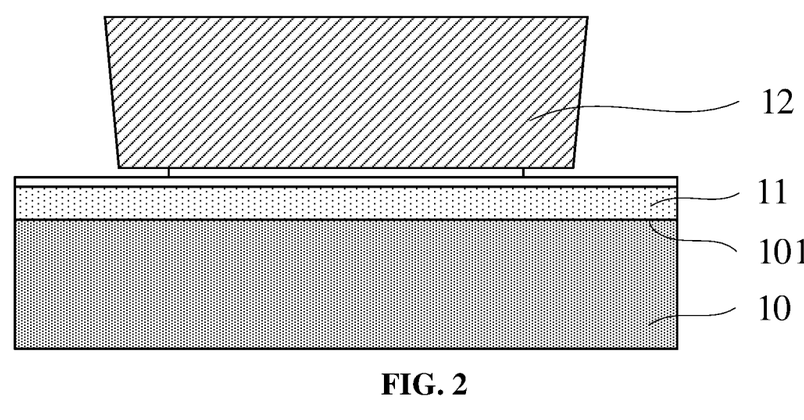
Figure 3:
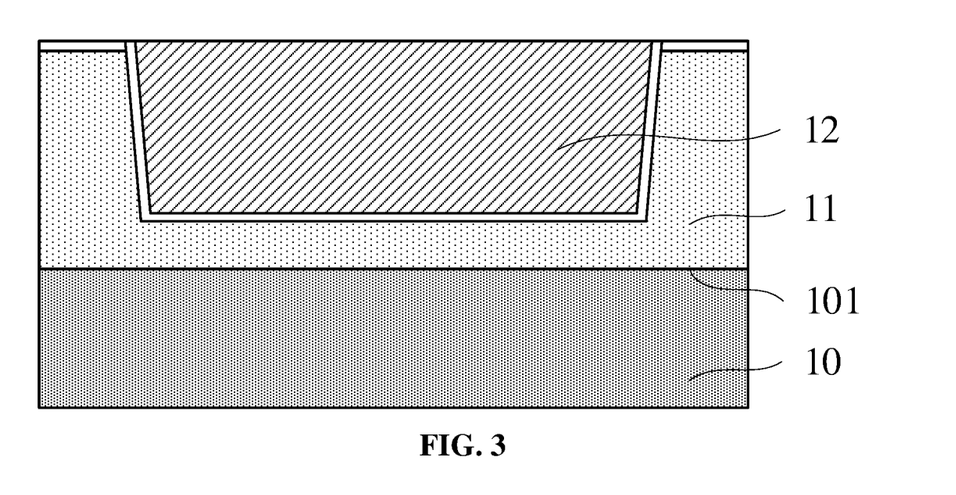

Referring to FIGS. 1-3, a conductive layer 12 is formed on a back surface 101 of a wafer 10, and at least one dielectric layer 11 is provided between the conductive layer 12 and the wafer 10. When there are a plurality of dielectric layers 11, the different dielectric layers 11 have different materials and functions.

The arrangement of the conductive layer 12 has the following problems. The dielectric layer 11 and the conductive layer 12 stacked on the back surface 101 increase the overall thickness of the semiconductor structure, thereby increasing the overall package size. In addition, a stack of the film layers exert stress on the wafer 10, thereby causing stress deformation of the wafer 10.

The stress exerted on the wafer 10 by film layers stacked on the back surface 101 (hereinafter referred to as a stack of the film layers, which includes the dielectric layer 11 and the conductive layer 12) comes from an internal stress of the stack of the film layers, a thermal stress inside the stack of the film layers, and a thermal stress between the stack of the film layers and the wafer 10. The internal stress is generally generated during the growth of the film layer, such as crystal mismatch, impurity incorporation, lattice reconstruction and phase transformation, while the thermal stress mainly caused by the difference between thermal expansion coefficients of adjacent film layers.

In order to solve the problems, the embodiments of the present application provide a semiconductor structure and a forming method thereof. A wafer back is patterned to form a groove, and a conductive layer is filled in the groove. The arrangement of the conductive layer will not increase the overall thickness of the semiconductor structure, a film layer will not be additionally stacked on a back surface of a wafer, and thus the overall package size of the semiconductor structure is favorably reduced, and the stress exerted on the wafer is reduced.

To more clarify the objects, technical solutions, and advantages of the embodiments of the present application, various embodiments of the present application will be described below in combination with the accompanying drawings. However, those of ordinary skill in the art will appreciate that in various embodiments of the present application, numerous technical details are set forth in order to provide readers with a better understanding of the present application. However, even without these technical details and various changes and modifications based on the following embodiments, the claimed technical solution of the present application may be implemented.

FIGS. 4 to 11 are schematic structure diagrams corresponding to steps of a manufacturing method of a semiconductor structure according to an embodiment of the present application.

Figure 4:
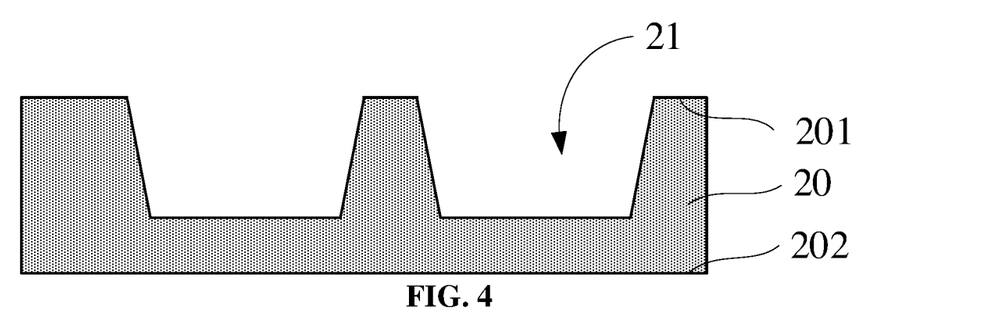
FIGS. 4 to 7 are schematic diagrams corresponding to steps of a forming method of a semiconductor structure according to an embodiment of the present application.

Referring to FIG. 4, a wafer 20 is provided. The wafer 20 has a front surface 202 and a back surface 201 opposite the front surface 202. The back surface 201 of the wafer 20 is patterned to form a groove 21 extending from the back surface 201 towards the front surface 202.

In the present embodiment, before patterning the back surface 201, the back surface 201 is also thinned to reduce the overall thickness of the wafer 20 and increase the flexibility of the wafer 20, thereby reducing the overall package size of the semiconductor structure and enabling the wafer 20 to tolerate greater stress deformation.

It should be noted that the thinned wafer 20 is also more susceptible to stress deformation while being able to tolerate greater stress deformation. Thus, in order to have a higher structural stability of the wafer 20 and the semiconductor structure including the wafer 20, the deformation stress exerted on the wafer 20 should be reduced on the basis of thinning the wafer 20.

Since the structural features of the groove 21 define the structural features of a conductive layer subsequently formed in the groove 21 to some extent, the structural features of the groove 21 need to be defined by actual packaging process requirements of the conductive layer when forming the groove 21. The actual packaging process for the conductive layer is related to specific components to be packaged, and the actual packaging process requirements include a relationship between the spacing of adjacent conductive layers and the minimum spacing of solder balls and the arrangement of a plurality of conductive layers.

Figure 5:
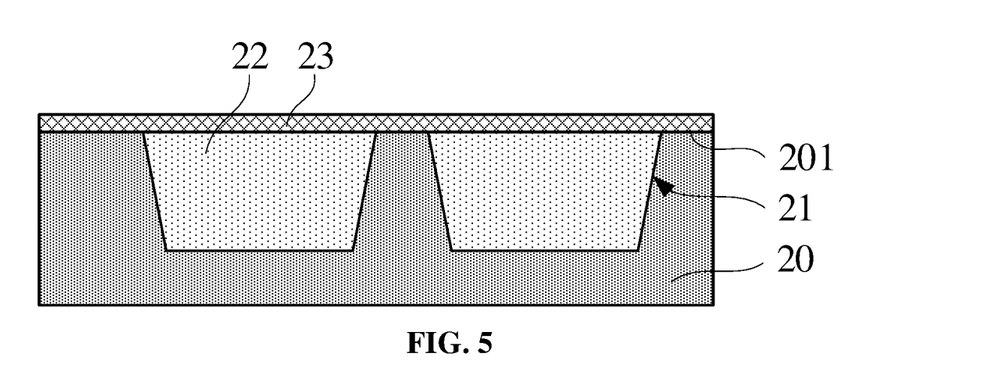

Referring to FIG. 5, the groove 21 is filled with a dielectric material to form a second dielectric film 22. A barrier layer 23 is formed on the back surface 201. The barrier layer 23 is configured for preventing metal ions from migrating into the wafer 20.

Process operation of forming the second dielectric film 22 includes: forming a first dielectric film which fills the groove 21 and covers the back surface 201; and performing a planarization process on the first dielectric film to remove a portion of the first dielectric film covering the back surface 201 to form a second dielectric film 22.

The dielectric material is configured for covering the subsequently formed conductive layer to avoid negative influences of electric leakage of the conductive layer on the wafer 20. Since the subsequently formed conductive layer is filled in the groove 21, the portion of the first dielectric film on the back surface 201 does not have an anti-leakage function and belongs to a redundant material. The removal of the portion of the first dielectric film covering the back surface 201 is advantageous to prevent the excess first dielectric film from exerting stress on the wafer 20, thereby reducing the stress on the wafer 20 and allowing the wafer 20 to have a high structural stability.

In the present embodiment, the barrier layer 23 is provided not only for prevent a metal material from depositing on the back surface 201 during the formation of the conductive layer, but also for prevent other metal materials from coming into contact with the back surface 201 after packaging.

Figure 6:
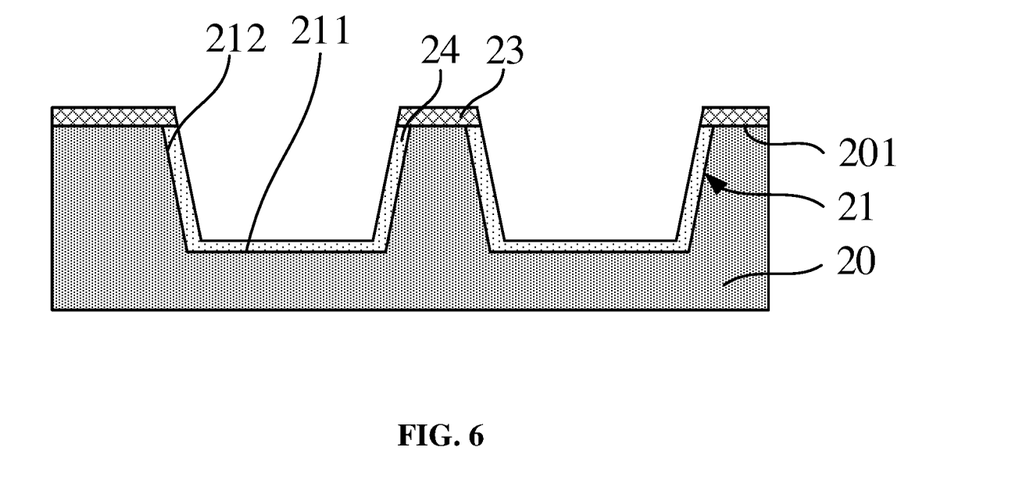

Referring to FIG. 6, the second dielectric film 22 (referring to FIG. 5) is subjected to an etching process to form a dielectric layer 24.

The second dielectric film 22 and the barrier layer 23 are subjected to an etching process to form a dielectric layer 24 covering a bottom 211 and a side wall 212 of the groove 21.

It should be noted that the thickness of the dielectric layer 24 may be the same or different in different directions that are perpendicular to the surface of the groove 21. Since the conductive layer filling the groove 21 is subsequently formed on the dielectric layer 24, the structural features of the conductive layer, including the position, the shape and the orthographic projection area in the direction perpendicular to the back surface 201, may be adjusted by controlling the thickness of the dielectric layer 24 in different directions.

In the present embodiment, the dielectric layer 24 is coplanar with the back surface 201 of the wafer 20, i.e., a top surface of the dielectric layer 24 and the back surface 201 are in the same plane, and the dielectric layer 24 is completely located in the wafer 20. In this way, it is advantageous to prevent the dielectric layer 24 from exerting an additional deformation stress on the back surface 201, and to allow the wafer 20 to have the high structural stability.

Figure 7:
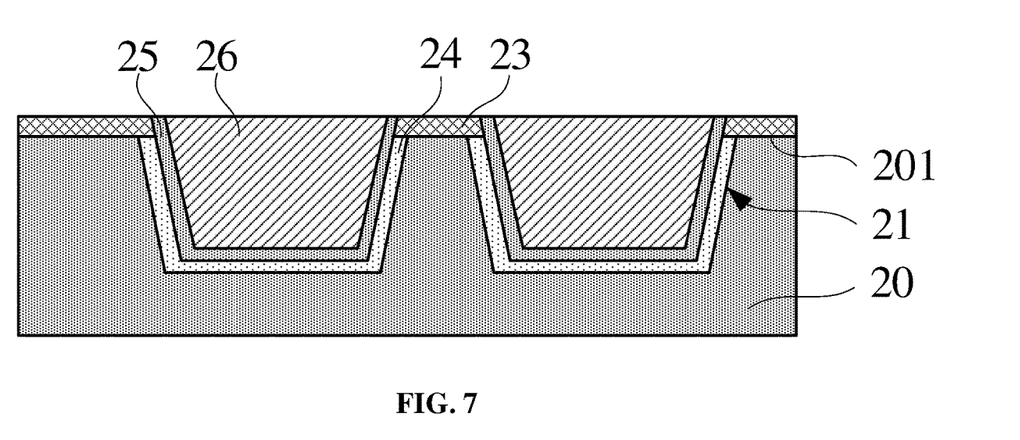

Referring to FIG. 7, a conductive layer 26 filling the groove 21 is formed on the dielectric layer 24.

In the present embodiment, a first barrier layer 25 and a conductive layer 26 are sequentially formed on the dielectric layer 24. The first barrier layer 25 is configured for prevent metal ions in the conductive layer 26 from migrating into the wafer 20. In other embodiments, a diaphragm layer for relieving the stress of the conductive layer or for adhering the conductive layer may also be arranged between the conductive layer and the dielectric layer.

In the present embodiment, the conductive layer 26 is coplanar with the barrier layer 23, that is, a top surface of the conductive layer 26 and a top surface of the barrier layer 23 are in the same plane, and the conductive layer 26 is completely located in a laminated structure consisting of the barrier layer 23 and the wafer 20. As such, the conductive layer 26 does not exert a deformation stress on the back surface 201 directly or through the barrier layer 23, thereby allowing the wafer 20 to have the high structural stability.

In the present embodiment, a wafer back surface is patterned to form a groove, and a conductive layer is filled in the groove. The arrangement of the conductive layer will not increase the overall thickness of the semiconductor structure. Moreover, there is no need to provide a dielectric layer with the function of preventing electric leakage on the wafer back surface, and thus the overall thickness of the semiconductor structure is favorably reduced, the stress exerted on the wafer back surface is reduced, and the packaged semiconductor structure has a smaller package size and better structural stability.

Another embodiment of the present application also provides a method of forming a semiconductor structure. In contrast to the previous embodiments, in the present embodiment, a conductive plug extending from the front surface towards the back surface is provided in the wafer, and a bottom surface of the conductive plug is located in the wafer. Reference will now be made in detail to FIGS. 8-11. FIGS. 8 to 11 are schematic structure diagrams corresponding to steps of a forming method of a semiconductor structure according to another embodiment of the present application. The same or corresponding forming steps as in the previous embodiment may be referred to in the corresponding description of the previous method embodiment and will not be described in detail below.

Figure 8:
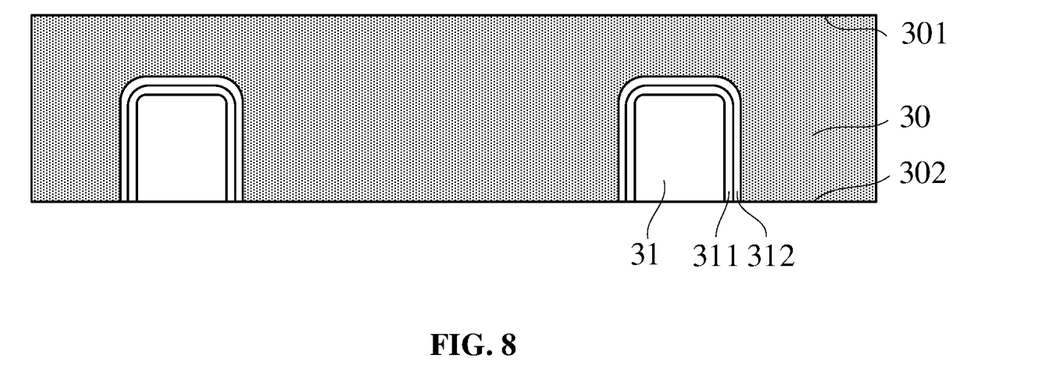
FIGS. 8 to 11 are schematic diagrams corresponding to steps of a forming method of a semiconductor structure according to another embodiment of the present application.

Referring to FIG. 8, a wafer 30 is provided. The wafer 30 has a front surface 302 and a back surface 301 opposite the front surface 302. A conductive plug 31 extending from the front surface 302 towards the back surface 301 is provided in the wafer 30. A bottom surface 313 of the conductive plug 31 is located in the wafer 30.

In the present embodiment, the bottom surface 313 of the conductive plug 31 is located in the wafer 30. In this way, a solder joint position of the back surface 301 of the wafer can be subsequently changed by adjusting the position of the conductive layer connected to the conductive plug 31, so as to ensure that the solder joint distribution on the semiconductor structure meets the actual packaging process requirements.

The surface of the conductive plug 31 is covered with a second barrier layer 311 and a first dielectric layer 312. The second barrier layer 311 is configured for prevent metal ions in the conductive plug 31 from migrating into the wafer 30. The first dielectric layer 312 is configured for preventing electric leakage of the conductive plug 31 from causing negative influence on the wafer 30.

In the present embodiment, the material of the second barrier layer 311 is a conductive material such as tantalum. In other embodiments, the material of the second barrier layer is a dielectric material, such as silicon carbonitride.

Figure 9:
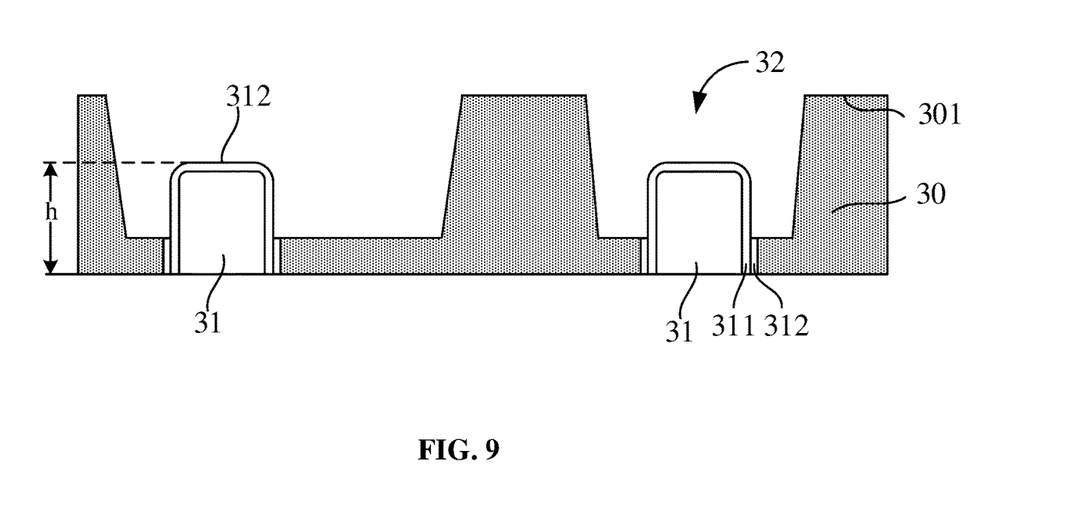

Referring to FIG. 9, the back surface 301 is patterned to form a groove 32 through which the conductive plug 31 is exposed.

The back surface 301 is patterned, and a portion of the first dielectric layer 312 covering the conductive plug 31 is removed to form a groove 32 through which the second barrier layer 311 is exposed. Since the material of the second barrier layer 311 is a conductive material, the retention of the second barrier layer 311 does not affect the electrical connection between the conductive plug 31 and the subsequently formed conductive layer.

In the actual process, whether to remove the second barrier layer 311 is mainly determined based on the following two factors. First factor is the electrical conductivity of the first barrier layer 311, and when the electrical conductivity of the second barrier layer 311 is higher than that of the conductive plug 31 or higher than that of a subsequently formed conductive layer, or when the electrical connection requirements between the conductive layer and the conductive plug 31 are met, the second barrier layer 311 may not be removed. Second factor is the time consumed by the removal process of the second barrier layer 311. The time consumed by removal process includes time for replacing an etching agent, time for replacing a reaction chamber, time for etching, time for cleaning before the etching, etc., and when the removal process of the second barrier layer 311 need to consume a long time, whether to remove the barrier layer may be determined according to current process cycle requirements and other standard requirements.

In the present embodiment, the bottom surface and a part of the side wall of the second barrier layer 311 are exposed through the groove 32. In other embodiments, only the bottom surface of the barrier layer is exposed through the groove.

The exposure of the part of side wall of the second barrier layer 311 is advantageous to increase a contactable region of the barrier layer 311 with the conductive layer. The increase in the contact region can results in a decrease in the resistance between the conductive plug 31 and the conductive layer, and thus the maximum current flow between the conductive plug 31 and the conductive layer is increased, and a power device connected to a solder joint can work effectively. In addition, the increase in the contactable region is advantageous to expand the position selection range of the conductive layer, that is, the conductive layer may be connected to the side wall of the second barrier layer 311 instead of the bottom surface. In this way, the orthographic projection of the conductive layer in the direction perpendicular to the back surface 301 may no longer coincide with the orthographic projection of the second barrier layer 311 in said direction, and thus the conductive layer may have a smaller orthographic projection area, thereby meeting the packaging process requirements better.

In the present embodiment, a plurality of conductive plugs 31 are provided in the wafer 30, and the plurality of conductive plugs 31 have the same bottom surface height h in the direction perpendicular to the back surface 301. In other embodiments, the plurality of conductive plugs have different bottom surface heights. When the grooves are formed, at least a portion of the surface of each conductive plug is exposed through a respective groove.

Figure 10:
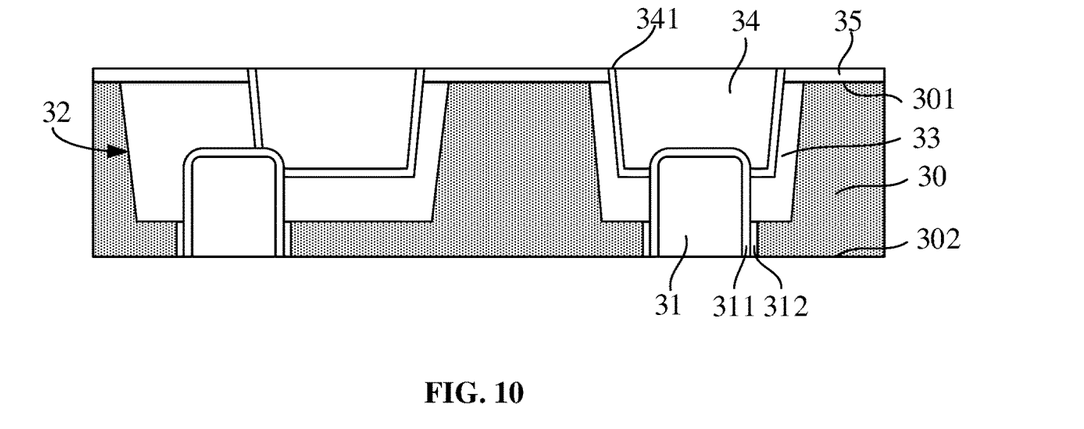
Figure 11:
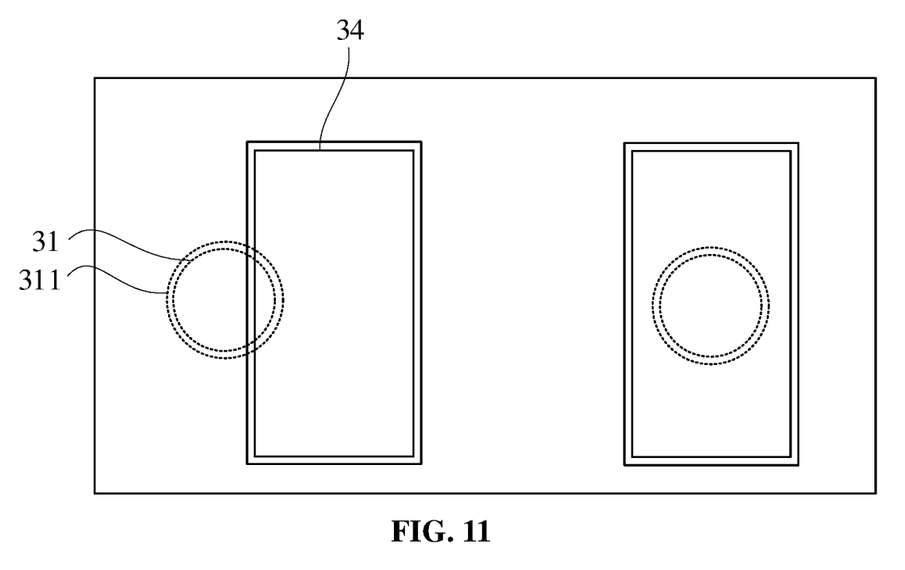

Referring to FIGS. 10 and 11, a conductive layer 34 filling the groove 32 is formed on the second dielectric layer 33.

In the present embodiment, the conductive layer 34 may serve as a Redistribution Layer (RDL) or a pad. The RDL is used to change the positions of solder joints to achieve the redistribution of the solder joints, to ensure that the arrangement of the solder joints meets the actual packaging process requirements.

Specifically, an orthographic projection of the second barrier layer 311 in the direction perpendicular to the back surface 301 is located in an orthographic projection of a top surface 341 of the conductive layer 34 in said direction, or the orthographic projection of the second barrier layer 311 partially coincides with the orthographic projection of the top surface 341 of the conductive layer 34, or the orthographic projection of the second barrier layer 311 does not coincide with the orthographic projection of the top surface 341 of the conductive layer 34.

It should be noted that when the conductive layer 34 is electrically connected to the second barrier layer 311 as an RDL, the orthographic projection of the second barrier layer 311 may partially coincide with either the orthographic projection of the top surface 341 of the conductive layer 34 or does not coincide with the orthographic projection of the top surface 341 of the conductive layer 34, which depends on the structure of the second dielectric layer 33. The partial coincidence includes: region coincidence and boundary coincidence.

In the present embodiment, since the conductive layer 34 used as an RDL is not located on a side of the barrier layer 35 away from the wafer 30, the arrangement of the conductive layer 34 does not exert a deformation stress on the back surface 301 directly or through the barrier layer 35. In addition, since the conductive layer 34 used as an RDL is located inside a stack consisting of the barrier layer 35 and the wafer 30, a film layer such as a barrier layer or a stress buffer layer for isolating the wafer 30 from the conductive layer 34 is also located inside the stack, i.e., the arrangement of the film layer such as the barrier layer or the stress buffer layer does not increase the package height of the semiconductor structure, and no additional deformation stress is exerted on the wafer 30. In addition, since the conductive layer 34 is coplanar with the barrier layer 35 and the conductive layer 34 serves as a solder joint, there is no need to provide an additional planarization layer to protect the conductive layer 34 and to define the position of a new solder joint. In this way, it is advantageous to further reduce the package height of the semiconductor structure and reduce the deformation stress exerted on the back surface of the wafer 30.

In the present embodiment, the conductive layer is connected to the conductive plug in the wafer, the conductive layer may be serve as a pad or an RDL. The pad may change the size and shape of the solder joint, and the RDL can change the position of the solder joint, so to ensure that the distribution and the shape and size of the solder joint on the back surface of the wafer meet the actual packaging process requirements.

Correspondingly, the embodiments of the present application also provide a semiconductor structure, which may be manufactured by the above-described method of forming the semiconductor structure.

Referring to FIG. 10, the semiconductor structure includes: a wafer 30, a groove 32, a dielectric layer 33, and a conductive layer 34. The wafer 30 has a front surface 302 and a back surface 301 opposite to the front surface 302. The groove 32 is located in the wafer 30. The groove 32 extends from the back surface 301 towards the front surface 302. The dielectric layer 33 covers a bottom and a side wall of the groove 32. The conductive layer 34 is located on a side of the dielectric layer 33 away from the wafer 30, and is filled in the groove 32.

In the present embodiment, the semiconductor structure further includes a barrier layer 35. The barrier layer 35 covers the back surface 301 of the wafer. The barrier layer 35 is configured for preventing metal ions from migrating into the wafer 30.

In the present embodiment, a conductive plug 31 extending from the front surface 302 towards the back surface 301 is provided in the wafer 30, and a bottom surface 313 of the conductive plug 31 is located in the wafer 30. The conductive layer 34 is connected to the conductive plug 31. An orthographic projection of the bottom surface 313 of the conductive plug 31 in a direction perpendicular to the back surface 301 of the wafer is located within an orthographic projection of a top surface 341 of the conductive layer 34 in said direction, or the orthographic projection of the bottom surface 313 of the conductive plug 31 partially coincides with the orthographic projection of the top surface 341 of the conductive layer 34, or the orthographic projection of the bottom surface 313 of the conductive plug 31 does not coincide with the orthographic projection of the top surface 341 of the conductive layer 34.

In the present embodiment, a plurality of conductive plugs 31 are provided in the wafer 30, the plurality of conductive plugs 31 have the same bottom surface height h, and each conductive plug 31 is connected to one conductive layer 34. In other embodiments, the plurality of conductive plugs have different bottom surface heights.

In the present embodiment, the conductive layer is located in the wafer, and there is no need to provide an additional dielectric layer on the back surface of the wafer to prevent the electric leakage of the conductive layer. In this way, it is advantageous to avoid the increase in the overall thickness of the semiconductor structure due to the stack of the dielectric layer and the conductive layer on the back surface, and prevent the stack of the film layers from exerting a larger deformation stress on the back surface of the wafer, and thus the semiconductor structure has a smaller package size and higher structure stability.

It will be appreciated by those of ordinary skill in the art that the various implementations described above are specific embodiments for implementing the present application and that various changes in form and details may be made in practice without departing from the spirit and scope of the present application. Any person skilled in the art can make various changes and modifications without departing from the spirit and scope of the present application, and therefore the scope of protection of the present application should be determined by the scope of the claims.

The invention claimed is:

1. A method for forming a semiconductor structure, comprising:
   providing a wafer having a front surface and a back surface opposite to the front surface, wherein at least one conductive plug provided in the wafer extends from the front surface towards the back surface;
   patterning the back surface of the wafer to form at least one groove extending from the back surface towards the front surface, and exposing at least a portion of a surface of the at least one conductive plug;
   forming a dielectric layer at a bottom and a side wall of the at least one groove; and
   forming, on the dielectric layer, at least one conductive layer filling the at least one groove and extending from the back surface towards the front surface, wherein the at least one conductive layer is electrically connected to the at least one conductive plug.

2. The method of claim 1, wherein the dielectric layer is coplanar with the back surface of the wafer.

3. The method of claim 1, wherein forming the dielectric layer comprises:
   forming a first dielectric film which fills the at least one groove and covers the back surface of the wafer;
   performing a planarization process to remove a portion of the first dielectric film covering the back surface of the wafer, to form a second dielectric film; and performing an etching process on the second dielectric film to form the dielectric layer.

4. The method of claim 3, further comprising, after the planarization process and before the etching process, forming a barrier layer on the back surface of the wafer, for preventing metal ions from migrating into the wafer.

5. The method of claim 4, wherein the barrier layer is coplanar with the at least one conductive layer.

6. The method of claim 1, wherein the at least one conductive plug is a plurality of conductive plugs, the at least one groove is a plurality of grooves, and the plurality of conductive plugs have different bottom surface heights in a direction perpendicular to the back surface of the wafer.

7. The method of claim 1, wherein at least a portion of the surface of the at least one conductive plug is exposed from the dielectric layer.

8. The method of claim 7, wherein an orthographic projection of a bottom surface of the at least one conductive plug in a direction perpendicular to the back surface of the wafer is located within an orthographic projection of a top surface of the at least one conductive layer in the direction.

9. The method of claim 7, wherein an orthographic projection of a bottom surface of the at least one conductive plug is partially coincident with an orthographic projection of a top surface of the at least one conductive layer.

10. The method of claim 7, wherein an orthographic projection of a bottom surface of the at least one conductive plug is non-coincident with an orthographic projection of a top surface of the at least one conductive layer.

11. A semiconductor structure, comprising:
   a wafer having a front surface and a back surface opposite to the front surface;
   at least one conductive plug, provided in the wafer, extending from the front surface towards the back surface;
   at least one groove located in the wafer and extending from the back surface towards the front surface;
   a dielectric layer covering a bottom and a side wall of the at least one groove; and
   at least one conductive layer located on a side of the dielectric layer away from the wafer and filling the at least one groove, wherein the at least one conductive layer extends from the back surface towards the front surface, and the at least one conductive layer is electrically connected to the at least one conductive plug.

12. The semiconductor structure of claim 11, further comprising: a barrier layer covering the back surface of the wafer for preventing metal ions from migrating into the wafer.

13. The semiconductor structure of claim 11, wherein a bottom surface of the at least one conductive plug is located in the wafer, and
   an orthographic projection of the bottom surface of the at least one conductive plug in a direction perpendicular to the back surface of the wafer is located within an orthographic projection of a top surface of the at least one conductive layer in the direction.

14. The semiconductor structure of claim 13, wherein the at least one conductive plug is a plurality of conductive plugs having different bottom heights, the at least one conductive plug is a plurality of conductive layers, each of the plurality of conductive plugs being connected to one of the plurality of conductive layers.

15. The semiconductor structure of claim 11, wherein a bottom surface of the at least one conductive plug is located in the wafer, and
   an orthographic projection of the bottom surface of the at least one conductive plug partially coincides with an orthographic projection of a top surface of the at least one conductive layer.

16. The semiconductor structure of claim 11, wherein a bottom surface of the at least one conductive plug is located in the wafer, and
   an orthographic projection of the bottom surface of the at least one conductive plug is non-coincident with an orthographic projection of a top surface of the at least one conductive layer.

* * * * *